United States Patent [19]

Kerns, Jr. et al.

[11] Patent Number: 4,551,685
[45] Date of Patent: Nov. 5, 1985

[54] PROGRAMMABLE GAIN FEEDBACK AMPLIFIER

[76] Inventors: David V. Kerns, Jr., 1452 Mitchell Ave.; David V. Kerns, 418 Vinnedge Ride, both of Tallahassee, Fla. 32303

[21] Appl. No.: 437,482
[22] Filed: Oct. 25, 1982
[51] Int. Cl.$^4$ .............................................. H03F 1/34
[52] U.S. Cl. .................................... 330/86; 330/282; 330/293
[58] Field of Search ................. 330/86, 278, 279, 282, 330/293

[56] References Cited

U.S. PATENT DOCUMENTS 3,177,350  4/1965  Abbott et al. ......................... 330/86
4,091,333  5/1978  Thrap .................................... 330/86

OTHER PUBLICATIONS

J. F. Gazin, "The MOS Transistor-An Analogue Switching Device Part 2: Applications" Electronic Components Sep. 10, 1974, vol. 16, No. 15.

Primary Examiner—James B. Mullins
Assistant Examiner—G. Wan

[57] ABSTRACT

The disclosed invention is a programmable gain feedback amplifier consisting of a high gain (op-amp) amplifier, feedback elements and fuse networks in the feedback and/or input paths, a decoding circuit for receiving an input programming command signal, and thereby selectively blowing (or opening) the proper fuses to establish the desired signal attenuation in said networks. After programming, the gain of the amplifier circuit is related to the total attenuation of the network(s), is permanently set, and does not require the programming signal to be continuously applied. Embodiments are described which are compatible with monolithic microelectronic fabrication techniques.

4 Claims, 7 Drawing Figures

PROGRAMMABLE GAIN FEEDBACK AMPLIFIER

BACKGROUND OF THE INVENTION

This invention relates to a programmable gain feedback amplifier. High gain differential amplifiers, particularly those fabricated by microelectronic techniques, are quite often used in applications whereby feedback is established from the output to the input by a network, the attenuation of which sets the closed loop gain of the amplifier circuit. The ability to improve the linearity and stability of an amplifier by use of negative feedback is demonstrated and described with reference to curves or plots and vector diagrams in addition to illustrative circuit diagrams in U.S. Pat. No. 2,102,671, granted to Harold S. Black on Dec. 21, 1937.

In general, providing negative feedback in an amplifier consists of coupling a portion of its output signal $E_o$ to its input terminal, but out of phase with the input signal $E_i$. In this way, distortions in the signal being amplified are corrected by the portion of the output signal fed back to the input terminal.

If the amplifier gain in the absence of feedback is A (the open loop gain), the output signal $E_o$ is equal to $AE_i$. If the portion of the output signal fed back is B, the feedback signal $E_f$ is equal to $\beta E_o$ where $\beta$ is the factor by which the output signal $E_o$ is multiplied to obtain $E_f$ and is a characteristic of the feedback circuit alone. Note that $\beta$ may be a complex quantity, depending on the feedback circuit design, and that A is usually a complex quantity.

The expression for the output signal $E_o$ with the negative feedback circuit connected to the input terminal of the amplifier is:

$$E_o = A(E_i + E_f)$$

By substituting $\beta E_o$ for $E_f$ and solving for $E_o$, the following expression is obtained:

$$E_o = \frac{A}{1 - A\beta} E_i$$

Because the closed loop gain is by definition the ratio $E_o/E_i$, the closed loop gain is found to be:

$$\frac{E_o}{E_i} = \frac{A}{1 - A\beta}$$

If A is very large, the closed-loop gain is approximately equal to $$-1/\beta$$

which depends only upon the value of $\beta$.

It is currently a common practice for a microelectronic high gain amplifier to be used in combination with an external feedback network, usually composed of discrete resistors to set the circuit gain. It has been shown, however, that the gain of a feedback amplifier can be programmed or controlled by switching in the proper resistive elements in the feedback (or input) networks by relay switches in U.S. Pat. No. 3,153,202 granted to Frank J. Woolam on Oct. 13, 1964, or by transistor switches as in U.S. Pat. No. 3,629,720 granted to Adel S. Sedra and Kenneth C. Smith on Dec. 21, 1971.

Under these circuits, the gain setting procedure is not permanent. Additionally, the gain control signal must be continuously applied. Finally, the circuit required to achieve the programmable gain is relatively complex.

Digital microelectronic devices, particularly programmable read only memories, have utilized a very simple mechanism for altering the circuit by a programming or controlling signal, namely the fusible element or fusible link.

DESCRIPTION OF THE INVENTION

Accordingly, it is the object of this invention to provide a scheme whereby fusible elements are utilized to alter the combination of elements in the feedback (or input) path of a high gain feedback amplifier thereby permanently setting the closed loop gain of the amplifier to a desired value. A decoding and programming circuit activated by a programming input signal is used to eliminate unwanted elements from the network by "blowing" the fusible elements associated with them and leaving the desired elements electrically connected.

It is the further object of the invention to provide a programmable gain by relatively simple, economical yet stable design which is readily adaptable to and/or compatible with integrated circuit fabrication techniques.

It is an additional object of this invention to provide a scheme whereby the closed loop gain of an amplifier can be set very precisely without external adjustment, by selecting through the programming just described small increments of gain until the exact desired gain value is achieved.

A feature of this invention is the simple yet permanent and effective means of setting the gain of an analog amplifier block. This approach realized with microelectronic fabrication techniques provides the system designer and manufacturer with a means for implementing analog gain functions with a substantially reduced component count external to the IC or integrated circuit chip. The gain setting resistor network is typically realized with components external to the integrated circuit amplifier, the invention enables the same result to be implemented as an integral part of the IC (integrated circuit) chip. The flexibility achieved by providing a programmable function for the component user which requires no external parts once placed in the systrem and is permanent in that it would not require additional I/O pins to be biased with programming signals for proper response gives this device a competitive advantage in terms of ease of use, simplicity, and reliability.

While there have been shown and described the preferred embodiments of the invention, it will be understood that the invention may be embodied otherwise than as herein specifically illustrated or described, and that certain changes in the form and arrangement of parts and in the specific manner of practicing the invention may be made without departing from the underlying idea or principles of this invention within the scope of the appended claims.

DESCRIPTION OF THE DRAWINGS

The foregoing and other objects, features, and advantages of the invention will be apparent from the following more particular description of several preferred embodiments of the invention, as illustrated in the accompanying drawing wherein.

DETAILED DESCRIPTION OF INVENTION

Figure 1:
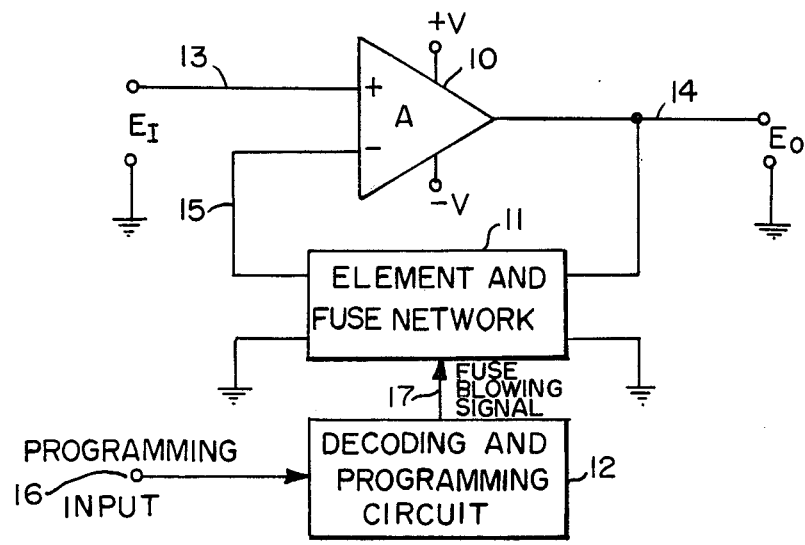
FIG. 1 is a simplified schematic of one embodiment of the programmable gain amplifier yielding no signal inversion.

An embodiment of the invention which produces no signal inversion is shown in FIG. 1. Amplifier 10 is a high voltage gain differential amplifier which has its output 14 connected through element and fuse network 11 back to its inverting input 15. The signal input 13 is provided on the non-inverting input to the high gain amplifier. The programming input 16 is applied to the means for decoding and programming 12. This decoding and programming circuit provides the required signal for blowing the proper fuse elements in the element and fuse network to establish the signal gain of the said element and fuse means 11. The voltage gain of this element and fuse network 11 sets the closed loop gain, $E_o/E_i$ for the entire amplifier configuration.

Figure 2:
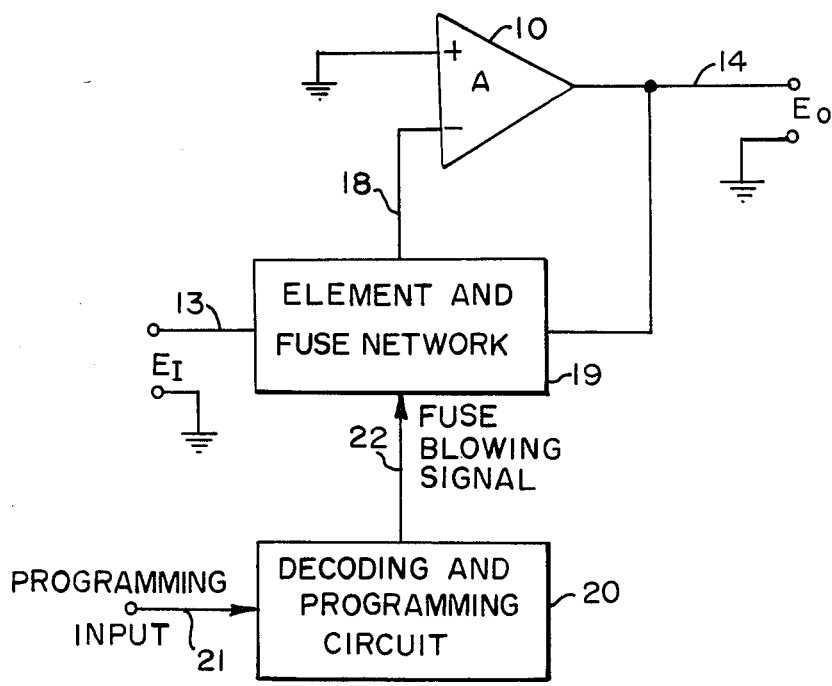
FIG. 2 is a simplified schematic of an alternate embodiment of the programmable gain amplifier giving signal inversion.

An alternate embodiment of the invention is shown in FIG. 2 which provides an inverting signal response from input to output. The high gain differential voltage amplifier 10 has its non-inverting input grounded and its signal output 14 connected to the input of element and fuse network means 19. A portion of this output signal is fed back to the inverting input of amplifier inverting input 18 of amplifier 10. The signal input voltage 13 is applied to the element and fuse network 19. The programming input 21 is applied to the decoding and programming circuit means 20. This latter circuit provides a fuse blowing signal 22 to the element and fuse network 19 which reconfigures the electrical connections within the fuse network by the opening of selected fuse elements. This process changes the voltage transfer characteristics of the element and fuse network 19 and thus changes permanently the closed loop gain of the entire amplifier configuration.

Figure 3A:
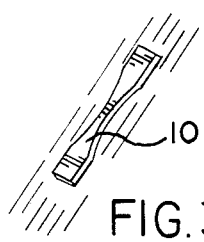
FIG. 3A and 3B show two embodiments of the fusible elements suitable for microelectronic fabrication techniques.
Figure 3B:
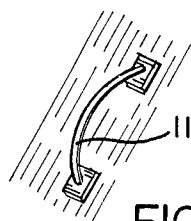

FIG. 3 shows two possible embodiments of the fuse elements. In integrated circuit fabrication technology, deposited films form both interconnect means and resistive means in various portions of the integrated circuit. For interconnect, deposited films of metals are commonly used, principally aluminum. For resistive means, metal films of nichrome and other higher resistance materials are sometimes deposited. In MOS circuits, layers of polysilicon are used both as gate material and interconnect. By the control of the thickness of these films and the geometry with a necked structure, a fuseable element 10 can be fabricated. This technique has been employed in microelectronic technology for the fabrication of nichrome fuseable link proms (programmable read only memories) and polysilicon fuseable link proms.

An alternate embodiment of fuseable link element is shown in FIG. 3 as an element 11 which spans the gap between two conductor pads on the integrated circuit chip.

The fuseable element has a cross-section which is such that a fusing current of known magnitude through this element can fuse open the element.

Figure 4:
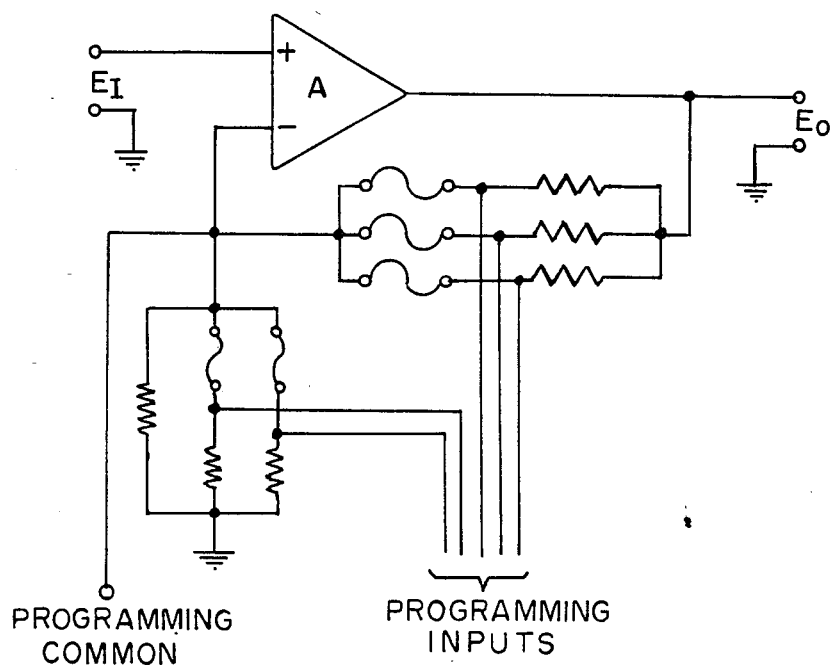
FIG. 4 is a detailed schematic showing a preferred embodiment of the programmable gain amplifier of the type shown in FIG. 1 with multiple lead programming input.

In FIG. 4, a detailed schematic showing an embodiment of the programmable gain feedback amplifier of the type described in detail in FIG. 1. In the embodiment shown in FIG. 4, a programming common connection is utilized only during the gain setting (programming) operation, together with a connection to the fusible link identified as associated with the resistive element to be disconnected from the circuit. Momentarily passing a large fusing current through the selected programming lead through the selected fuse to the programming common lead opens the selected fuse and disconnects its associated resistance from the amplifier circuit. This resulting change in the feedback network permanently alters the gain of the feedback amplifier circuit.

Figure 5:
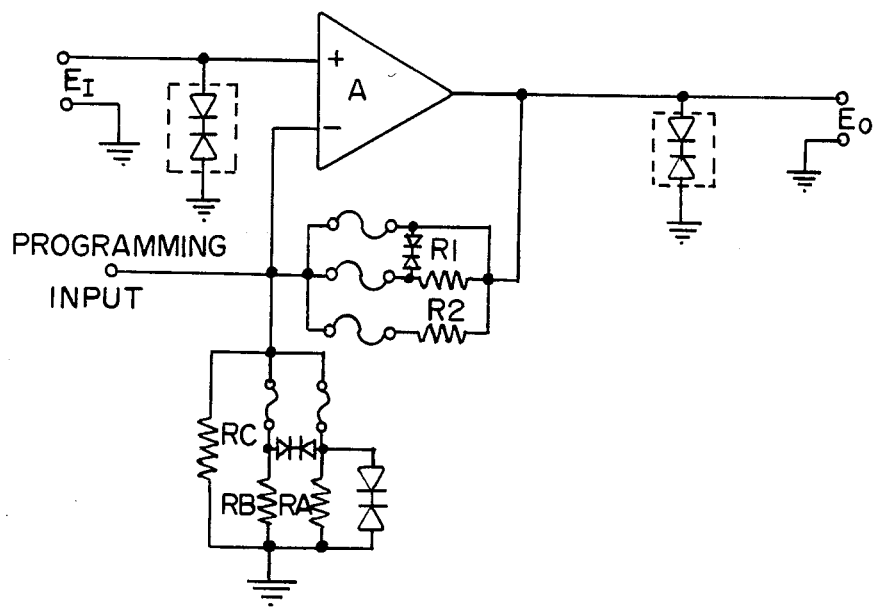
FIG. 5 is a detailed schematic showing a preferred embodiment of the programmable gain amplifier of the type shown in FIG. 4., however, with the added feature of a diode decoding and programming circuit which reduces the large number of external connections required for programming to one.

In FIG. 5 an embodiment of the invention is shown in detail which is similar in operation to that described in FIGS. 1 and 4, but where diode decoding circuits are used to direct the fusing current to the proper fusible element. This eliminates the need for multiple programming leads, reducing the programming to one lead. The back-to-back diode configurations will pass a current only when the avalanche breakdown voltage of the diode is exceeded. Thus programming can be accomplished by blowing the directly connected fusible element by the application of a voltage less than the diode breakdown voltage from the programming lead to the amplifier output or input depending on which network is being programmed. The subsequent application of a voltage larger than the diode breakdown voltage will apply the fusing current to the fusible element separated by one diode pair. The application of twice the diode breakdown voltage will fuse open the fusible element separated by two diode pairs in series. In this manner various combinations of resistive elements can be removed from the circuit to set the feedback amplifier's gain at one of a number of possible selections.

Figure 6:
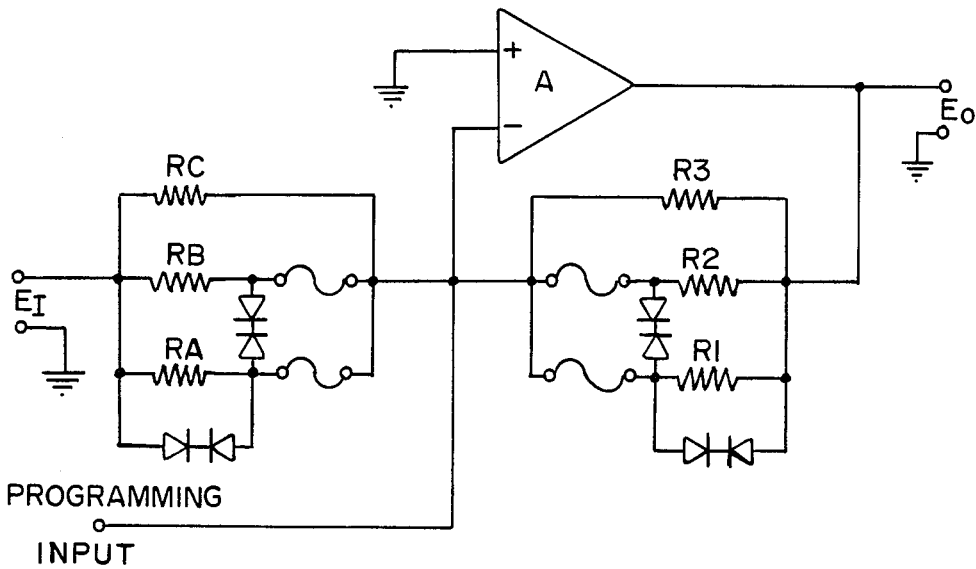
FIG. 6 is a detailed schematic showing a preferred embodiment of the programmable gain amplifier of the type shown in FIG. 2 with a diode decoding circuit to reduce the number of external programming leads required to one.

In FIG. 6, diode decoding is again used to direct the fusing current to the selected fusible element reducing the programming leads to one, however the feedback amplifier configuration utilized in this embodiment is that explained in detail in FIG. 2.

What is claimed is:

1. A feedback amplifier contained in an integrated circuit, the gain of the amplifier can be permanently set after fabrication said feedback amplifier comprising
   a high gain differential amplifier, referred to also as an operational amplifier,
   a feedback network integrated with said high gain differential amplifier and consisting of multiple resistive means each (or some) of which is associated with fusible means of predetermined current capacity, said feedback network being connected from the output of the high gain differential amplifier to the inverting input of said amplifier such that the effective signal attenuation of the feedback network controls the voltage gain of the feedback amplifier and a decoding and programming means integrated with said feedback network whereby current is selectively directed to the appropriate fusible means to open electrically the selected fuses, the gain of the feedback amplifier circuit then being permanently set by the attenuation of the resistive means remaining electrically operative.

2. A feedback amplifier as defined in claim 1 wherein the multiple resistive means and associated fusible means therein described are placed in one of the signal paths associated with the high gain differential voltage amplifier other than the signal path from the output to the inverting input of said amplifier in such manner that the circuit gain is also similarly permanently set after fabrication.

3. A feedback amplifier contained in an integrated circuit and embodying a network of resistive and associated fusible means and a high gain differential voltage amplifier (i.e., operational amplifier), the gain of the feedback amplifier being permanently fixable after fabrication by selecting the desired resistive means by the selective blowing of the fusible means, and a decoding and programming cirucit integrated with said high gain differential voltage amplifier to effectuate the desired programming.

4. A feedback amplifier embodying a network of resistive and associated fusible means and a high gain differential voltage amplifier (i.e., operational amplifier), the gain of the feedback amplifier being permanently fixable after fabrication by selecting the desired resistive means by the selective blowing of the fusible means, and a decoding and programming circuit to effectuate the desired programming, the high gain differential voltage amplifier being contained in one integrated circuit and the resistive and fusible means and the decoding and programming circuit being contained in another integrated circuit with both integrated circuits being bonded together by means of electrical connections.

* * * * *